United States Patent [19]

Petritis et al.

[11] Patent Number: 4,647,861
[45] Date of Patent: Mar. 3, 1987

[54] METHOD AND MEANS FOR PRODUCING A D.C. SIGNAL PROPORTIONAL TO THE PEAK AMPLITUDE OF AN A.C. SIGNAL

[75] Inventors: Demetris Petritis, New Britain; Robert S. Lundin, Northfield; John H. Crozier, Trumbull, all of Conn.

[73] Assignee: The Superior Electric Company, Bristol, Conn.

[21] Appl. No.: 671,250

[22] Filed: Nov. 14, 1984

[51] Int. Cl.⁴ .................. H03K 5/00; H03K 17/00; H03B 19/00
[52] U.S. Cl. ................................. 328/26; 328/32; 328/158; 328/20; 307/529; 307/261
[58] Field of Search .............. 328/26, 32, 156, 150, 328/142, 20; 307/261, 350, 351, 490, 498, 519, 529; 324/103 P; 330/279; 363/157, 159, 126

[56] References Cited
U.S. PATENT DOCUMENTS

| | | | |
|---|---|---|---|
| 3,411,066 | 11/1968 | Bravenec | 363/126 |
| 3,529,258 | 9/1970 | Schulz | 330/270 |
| 3,944,906 | 3/1976 | Hill et al. | 328/26 |
| 4,317,052 | 2/1982 | Morris | 307/261 |
| 4,400,630 | 8/1983 | Owen | 328/20 |

Primary Examiner—Stanley D. Miller
Assistant Examiner—Trong Quang Phan
Attorney, Agent, or Firm—John H. Crozier

[57] ABSTRACT

Method and means are disclosed for producing a D.C. signal proportional to the peak amplitude of an A.C. signal, which peak amplitude is proportional to the frequency of the A.C. signal. A second A.C. signal is generated from the first signal, having a frequency higher than that of the first signal and the second signal is rectified to produce an analog signal. The increase in frequency permits the subsequent processing of the analog signal in a high-frequency filter having a lower time-constant than would be possible were the analog signal produced directly by rectifying the first A.C. signal.

3 Claims, 7 Drawing Figures

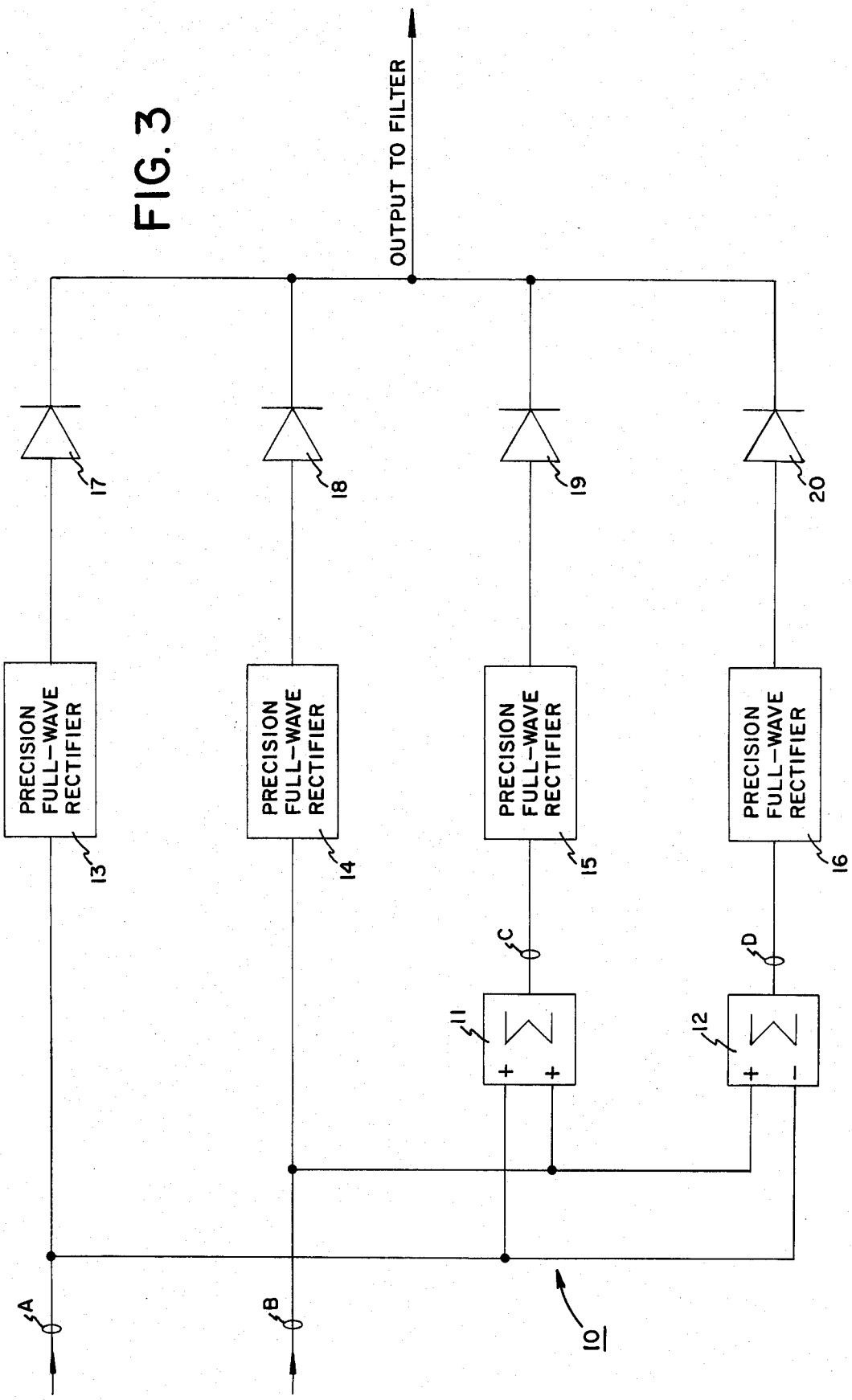

METHOD AND MEANS FOR PRODUCING A D.C. SIGNAL PROPORTIONAL TO THE PEAK AMPLITUDE OF AN A.C. SIGNAL

BACKGROUND AND SUMMARY

This invention relates to the production of a D.C. analog signal proportional to the peak amplitude of an A.C. signal, which peak amplitude is proportional to the frequency of the A.C. signal, and more particularly to a method of producing from one or more A.C. signals a D.C. analog signal that may be filtered with a filter having a relatively low time-constant.

Although for illustration of a particular application of the invention, the source of the alternating current signals described as being a rotary magnetic encoder, it will be understood that the invention is applicable, as well, to any case where an analog signal is derived from one or more alternating current signals.

A rotary magnetic encoder may include a cylindrical rotating magnetic member on the outer circumference of which is a continuous series of N-S magnetic poles. A stationary member holds one or more detectors so disposed that, as the rotating member rotates, the flux at successive magnetic poles links the poles with the detector and the detector produces a characteristic sine wave output. Each full cycle of the sine wave represents the movement of one N-S pair of poles past the detector. It is common to employ two detectors on the stationary member, displaced 90 electrical degrees from one another, with respect to the magnetic poles to double the number of total pulses per revolution for increased resolution. Thus, two essentially identical sine waves in quadrature with one another are produced with identical frequencies proportional to the speed of the rotating member. These two sine waves may then be rectified and filtered to produce an analog signal proportional to the frequency of the sine waves.

The processing of the sine waves may, in some applications, result in undesirably high ripple in the analog signal and high time-lag in changes of that signal behind changes in the peak amplitude, consequent upon changes in frequency, of the A.C. signal. These two characteristics are related by the nature of the rectifying and filtering steps because rectification of the two sine waves produces a waveform with only twice the frequency of the primary waves, with a relatively large amount of ripple. The low frequency of the ripple voltage requires a filter with a high time-constant and the large amount of ripple requires a high degree of filtering. This results in an analog signal which responds to changes in the peak amplitude of the A.C. signal with a time lag to an undesirable degree for some control applications.

Accordingly, an object of the present invention is to provide a method of producing a D.C. analog signal which is proportional to the peak amplitude of one or more identical A.C. signals, which is relatively free of ripple, and which responds to changes in such peak amplitude with a minimum amount of lag time.

The present invention overcomes some of the limitations of prior art by increasing the frequency of the ripple voltage of the rectified waveform so that filtering may be accomplished with a high-frequency filter having a low time-constant. In one embodiment of the invention, the means by which the frequency is increased further reduces the degree of filtering required, since the greater the ripple frequency, the lower will be the amplitude of the ripple.

It will be understood that, in accordance with conventional nomenclature, whenever "sine wave" or the equivalent is used herein, it means an electrical alternating current signal having a sinusoidal waveform. It will also be understood that the signal may not be a pure "sine wave", but is a periodic signal having sinusoidal characteristics.

BRIEF DESCRIPTION OF THE DRAWING

FIG. 3 is a schematic/block diagram of the method of FIG. 2.

DETAILED DESCRIPTION OF THE PREFERRED EMBODIMENTS

Figure 1A:
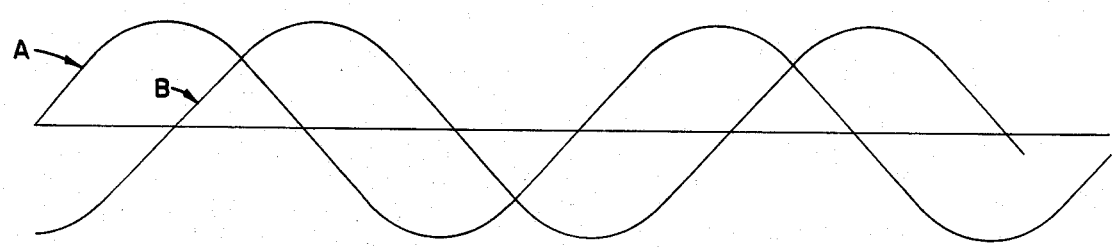
FIGS. 1(a) and 1(b) show the conventional method of processing two sine waves.
Figure 1B:
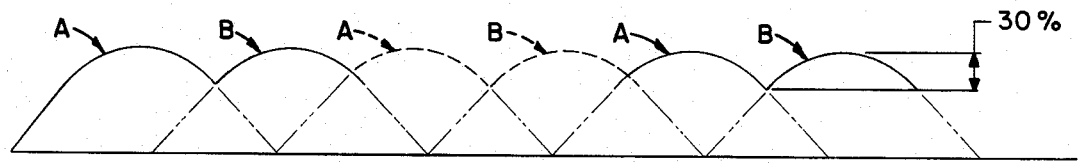

Referring to the Drawing, (a) of FIG. 1 shows two sine waves, A and B, of equal frequencies, in quadrature with one another, which may be assumed to have been produced by a rotary magnetic encoder or any of a number of other devices which produce such waves. Full-wave rectification of A and B produces the characteristic waveform shown on (b) of FIG. 1, with the dashed portions representing the lower halves of full cycles of A and B. As noted, the rectified two-phase signal has a ripple content equal to approximately 30 percent of the peak value of the waveform, with a frequency four times that of the fundamental frequency. The high degree of ripple requires substantial filtering; but more important, the relatively low frequency of the ripple voltage requires use of a filter with a relatively high time-constant.

Figure 2A:
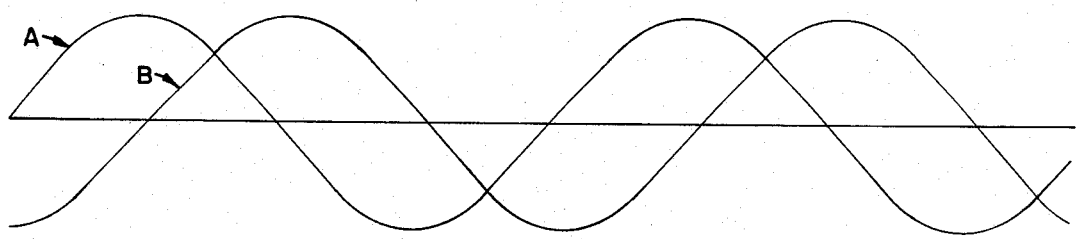
FIGS. 2(a)–2(c) show waveforms illustrating one method of processing two sine waves according to the present invention.
Figure 2B:
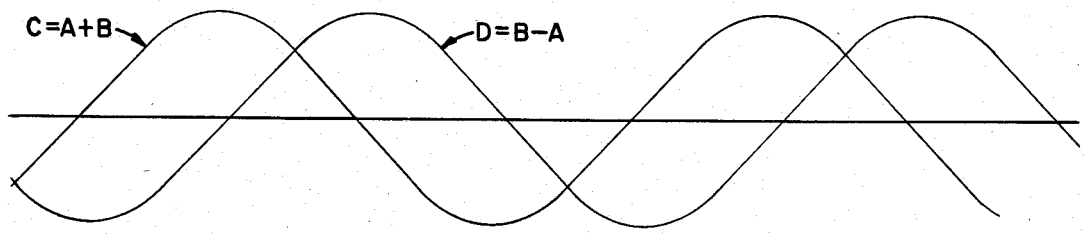
Figure 2C:
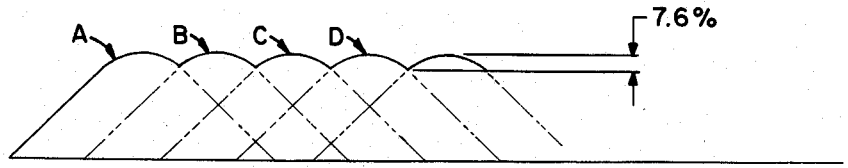

FIG. 2 illustrates one technique to accomplish the object of the present invention to reduce ripple voltage. The primary sine waves A and B are shown on (a) of FIG. 2. Two additional sine waves, C and D, are derived from A and B and are shown on (b) of FIG. 2, with C being the sum of A and B and D being B minus A. Thus, the two-phase input has been converted to a four-phase input, with the phases displaced 45°, and, when rectified, the waveform shown on (c) of FIG. 2 is produced. The ripple amplitude has now been reduced to about 7.6 percent of the peak value of the waveform and the frequency has been increased to eight times the fundamental frequency. The signal thus produced after rectification is amplified through a scaling amplifier and filtered. Because the frequency of the rectified signal is high compared to the fundamental frequency, filters with a low time-constant can be employed, thereby minimizing the introduction of lag into the response time. Also, the magnitude of the ripple voltage has been reduced to about 7.6% of peak, thus requiring a lesser degree of filtering.

FIG. 3 is a schematic/block diagram showing a circuit for carrying out the method of the invention described above. The circuit, indicated generally by the reference numeral 10, receives as inputs sine waves A and B. Sine waves A and B are combined in an adder 11 to form sine wave C. Sine wave A is subtracted from sine wave B in an adder 12 to form sine wave D. Sine waves A, B, C, and D are then processed, respectively, in precision full-wave rectifiers 13, 14, 15, and 16 the outputs from which pass respectively, through precision half-wave rectifiers 17, 18, 19, and 20. The rectifiers 17, 18, 19, and 20 collectively comprise a summing network the output of which is the highest value of the individual inputs. The rectified and combined waveforms comprise the output of the circuit 10 and may subsequently be filtered in a high-frequency filter having a lower time-constant than would be possible were the analog signal produced directly from the primary sine waves.

While the foregoing has described an embodiment of the present invention which processes two sine wave inputs, the practicising of the invention is not limited to such a case. It is also not intended that the invention be limited to the derivation of only two additional sine waves from the primary sine waves, as one having ordinary skill in the art could produce additional sine waves which would achieve the object of the invention by further increasing the frequency of the ripple voltage of the rectified waveform.

Figure 4:
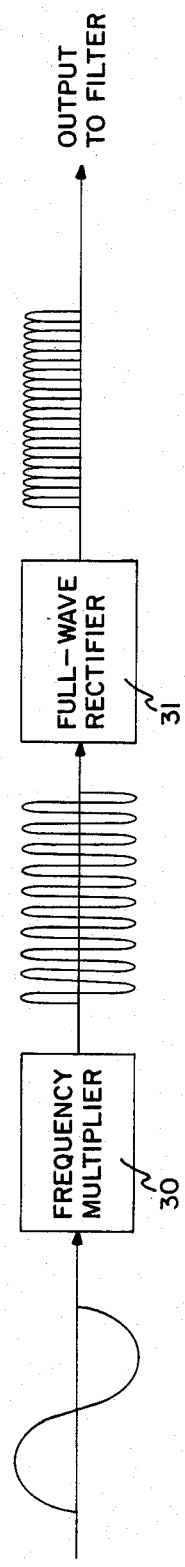
FIG. 4 is a block diagram showing a method of processing a single sine wave according to the present invention.

Another embodiment of the present invention is shown on FIG. 4. Here, a single primary sine wave input, A, is processed in a frequency multiplier circuit 30 which produces a sine wave having any desired frequency which is an integer multiple of the sine wave input. The generated higher frequency sine wave is processed in a full-wave rectifier 31 which produces a rectified waveform having a ripple voltage that is 100 percent of the fundamental frequency, but one which can be made of such high frequency that an acceptably smooth analog output can be produced using a filter with an extremely low time-constant.

It will be understood that what has been disclosed is a method for allowing the use of a filter with a low time constant for filtering the waveform produced by the rectification of one or more, essentially identical, sine wave inputs of equal frequency, by increasing the frequency of the rectified sine waves.

Since certain changes may be made in carrying out the above invention without departing from the scope thereof, it is intended that all matter contained in the above description or shown in the accompanying Drawing shall be interpreted as illustrative and not in a limiting sense.

It is also intended that the following claims are intended to cover all of the generic and specific features of the invention herein described, and all statements of the scope of the invention which, as a matter of language, might be said to fall therebetween.

We claim:

1. A method of producing a D.C. analog signal proportional to the peak amplitudes of first and second, essentially identical A.C. signals having essentially sinusoidal waveforms, which peak amplitudes are proportional to the frequency of said first and second A.C. signals, comprising:
   (a) generating a third A.C. signal which is the sum of said first and second signals,
   (b) generating a fourth A.C. signal which is said second A.C. signal minus said first A.C. signal;
   (c) rectifying said first, second, third, and fourth A.C. signals; and
   (d) combining said rectified first, second, third and fourth A.C. signals to produce said D.C. analog signal;

where said D.C. analog signal thus produced may be subsequently processed in a filter having a lower time-constant than would be possible were said D.C. analog signal produced directly by rectifying said first and second A.C. signals.

2. Means for producing a D.C. analog signal proportional to the peak amplitudes of first and second, essentially identical A.C. signals having essentially sinusoidal waveforms, which peak amplitudes are proportional to said frequency of the first and second A.C. signals, comprising:
   (a) means connected to said first and second A.C. signals for generating a third A.C. signal which is the sum of said first and second signals,
   (b) means connected to said first and second A.C. signals for generating a fourth A.C. signal which is said second A.C. signal minus said first A.C. signal;
   (c) means connected to (a) and (b) and to said first and second A.C. signals for rectifying said first, second, third, and fourth A.C. signals; and
   (d) means connected to (c) for combining the rectified first, second, third and fourth A.C. signals to produce said D.C. analog signal;

wherein said D.C. analog signal thus produced may be subsequently processed in a filter having a lower time-constant than would be possible were said D.C. analog signal produced directly by rectifying said first and second A.C. signals.

3. The means for producing a D.C. analog signal, as defined in claim 2, further defined, wherein:
   (a) said means for generating said third A.C. signal is an adder;
   (b) said means for generating said fourth A.C. signal is an adder;
   (c) said means for rectifying said first, second, third, and fourth A.C. signals are first, second, third, and fourth precision full-wave rectifiers; and
   (d) said means for combining said rectified first, second, third, and fourth A.C. signals are precision half-wave rectifiers.

* * * * *

UNITED STATES PATENT AND TRADEMARK OFFICE
CERTIFICATE OF CORRECTION

PATENT NO. : 4,647,861

DATED : March 3, 1987

INVENTOR(S) : Demetris Petritts et al.

It is certified that error appears in the above-identified patent and that said Letters Patent is hereby corrected as shown below:

On the Title Pate, Item [75] Inventors: delete "John H. Crozier, Trumbull".

Signed and Sealed this

Twenty-fifth Day of August, 1987

*Attest:*

DONALD J. QUIGG

*Attesting Officer*   *Commissioner of Patents and Trademarks*